United States Patent [19]

Proebsting

[11] Patent Number: 5,572,471
[45] Date of Patent: Nov. 5, 1996

[54] REDUNDANCY SCHEME FOR MEMORY CIRCUITS

[75] Inventor: Robert J. Proebsting, Los Altos Hills, Calif.

[73] Assignee: Townsend and Townsend Khourie and Crew, San Francisco, Calif.

[21] Appl. No.: 515,616

[22] Filed: Aug. 17, 1995

Related U.S. Application Data

[62] Division of Ser. No. 252,284, May 31, 1994, Pat. No. 5,495,445.

[51] Int. Cl.$^6$ .................................................. G11C 11/40
[52] U.S. Cl. .................................. 365/200; 365/208
[58] Field of Search ........................... 365/200, 154, 365/156, 149, 206, 207, 208

[56] References Cited

U.S. PATENT DOCUMENTS

| | | | |
|---|---|---|---|
| 4,464,754 | 8/1984 | Stewart et al. | 371/51 |
| 4,577,294 | 3/1986 | Brown et al. | 365/200 |
| 4,635,232 | 1/1987 | Iwahashi | 365/200 |
| 4,641,279 | 2/1987 | Kimura | 365/149 |
| 4,687,951 | 8/1987 | McElroy | 307/269 |
| 5,265,047 | 11/1993 | Leung | 365/156 |
| 5,450,360 | 9/1995 | Sato | 365/200 |

OTHER PUBLICATIONS

IBM Technical Disclosure Bulletin, vol. 34, No. 4A, Sep. 1991, New York US pp. 271–273, XP000210909 "Direct Memory Redundancy".

*Primary Examiner*—A. Zarabian
*Attorney, Agent, or Firm*—Townsend and Townsend and Crew LLP

[57] ABSTRACT

A redundancy scheme for memory circuits that eliminates the need for physical disconnection or logical deselection of defective elements. The invention does not require disabling a defective element and allows it to operate and generate bad data. The circuit is designed such that the redundant element is able to override the defective element. Various approaches to row and column redundancy based on this principal are disclosed for memory circuit such as dynamic and static random access memories.

2 Claims, 4 Drawing Sheets

5,572,471

REDUNDANCY SCHEME FOR MEMORY CIRCUITS

This application is a division of application Ser. No. 08/252,284, filed May 31, 1994, U.S. Pat. No. 5,495,445.

BACKGROUND OF THE INVENTION

The present invention relates in general to integrated circuit memories, and in particular to an improved redundancy scheme used in memory circuits.

To reduce manufacturing costs, manufacturers of integrated circuits search for ways to improve yields and reduce the rejection rate for defective individual parts. One method of reducing the rejection rate is to provide redundant or auxiliary circuit components on the integrated circuit. This method is practical where testing can locate the defective component, and the circuit is readily reconfigurable to substitute a redundant equivalent for the defective component. This method is widely used in integrated circuit memory arrays such as random access memories.

Memory circuits are characterized by the regular repetition of multitudes of memory cells. The location of each memory cell is defined by a unique address which typically identifies a particular row and column in the memory matrix arrays. The memory circuit includes row and column decoders that decode different combinations of signals at an address input to the memory circuit. Memory circuits provide for redundancy by including on the same circuit several duplicate rows and/or columns of memory cells to replace any row or column having defective memory cells. Separate decoders are provided for the redundant rows or columns that are programmable using programming elements such as fusible links. Once the integrated circuit is tested and the locations of the defective memory cells are determined, the programmable redundancy decoders are programmed to decode those addresses that correspond to the rows or columns with defective cells. The defective rows or columns are subsequently disabled. This way every time a defective row or column is addressed, a redundant equivalent is selected instead.

To disable the defective rows or columns, existing memory circuits typically either physically disconnect the defective element using laser blown fuses, or logically deselect the defective row or column. There are problems associated with both these methods. Physically disconnecting a defective row or column typically requires laser zapping of fuse elements that are spaced at the pitch of the column or row. The close spacing between the fuse elements makes them very difficult targets to hit and requires great accuracy in laser zapping. Fuse elements also tend to take a large silicon area adding to the size and cost of the integrated circuit. Logical deselection of the defective element requires adding a disable input to the main decoders. This input is driven by the output of the programmable redundancy decoder such that when a redundant row or column is selected, the output is asserted, logically disabling the main decoders. This approach, however, slows down the device by adding to the memory access time. Because there are a few gate delays between the time a redundant element is selected to the time the main decoders are disabled, there is a short interval during which the main decoder selects the defective element, and the redundant decoder selects a spare row or column. Therefore, the access must be delayed until the defective element is cleared before reading data.

There is therefore a need for improved redundancy schemes for use in memory circuits.

SUMMARY OF THE INVENTION

The present invention offers a redundancy method, and circuits for performing the method, that eliminate the need for deselection either with fusible links or with logical deselection. The redundancy method of this invention allows the contents of a selected equivalent redundant element to override the contents of a selected defective element. The defective element need not be disabled, and is allowed to generate bad data. Therefore, the circuit neither requires laser zapping of fuse elements at the pitch of the column line, nor does it suffer from delays caused by the logical deselection circuitry.

In one embodiment, the present invention offers a method for providing redundancy in integrated circuit memories including the steps of testing the circuit to determine locations of defective elements; programming the circuit to select a corresponding redundant element when a defective element is addressed; allowing the defective element to generate defective information when addressed; and overriding the defective information by information generated by the corresponding redundant element.

One embodiment of a circuit for performing the method of the present invention includes a memory circuit with a plurality of memory cells each located at an intersection of a column and a row, and address decoders for selecting a memory cell by asserting a global decode line in response to an address input. The memory circuit further includes redundant memory elements and programmable redundant decoders for selecting redundant memory elements by asserting a redundant decode line. The circuit also includes transistors for coupling selected bit lines to a data line in response to the global decode lines and redundant decode lines. The data line is resistively coupled to a predetermined voltage and couples through a resistive means to an input of a voltage sensing means that detects the contents of the accessed memory cell. Current flows through the resistive means only by selection of a redundant element. As a result, a larger voltage drop occurs on the input to the sensing means when a redundant decode line is asserted. At the input of the voltage sensing means, the larger voltage drop caused by selection of a redundant element on the data line, as compared to the normal voltage drop, effectively overrides the impact of the defective memory cell on the data line. Thus, the contents of the redundant memory override the contents of the defective memory without the need to disconnect or deselect the defective memory element.

In another embodiment, the present invention provides redundant elements in a memory circuit that include memory cells larger in size than those used in the primary elements. The redundant memory cell can have either a storage capacitor that is larger than the size of the storage capacitors in primary DRAM memory cells, or memory cell access transistors that are larger in size as compared to access transistors used in primary SRAM memory cells. The larger redundant memory cell may be made up of two normal sized memory cells operating in parallel. A larger memory cell according to this embodiment generates a stronger signal that can dominate the output of the smaller primary defective cell. Thus, the defective element need not be disconnected or deselected.

A better understanding of the nature and advantages of the redundancy circuit of the present invention may be had by referring to the detailed description and the diagrams below.

DESCRIPTION OF SPECIFIC EMBODIMENTS

Figure 1:
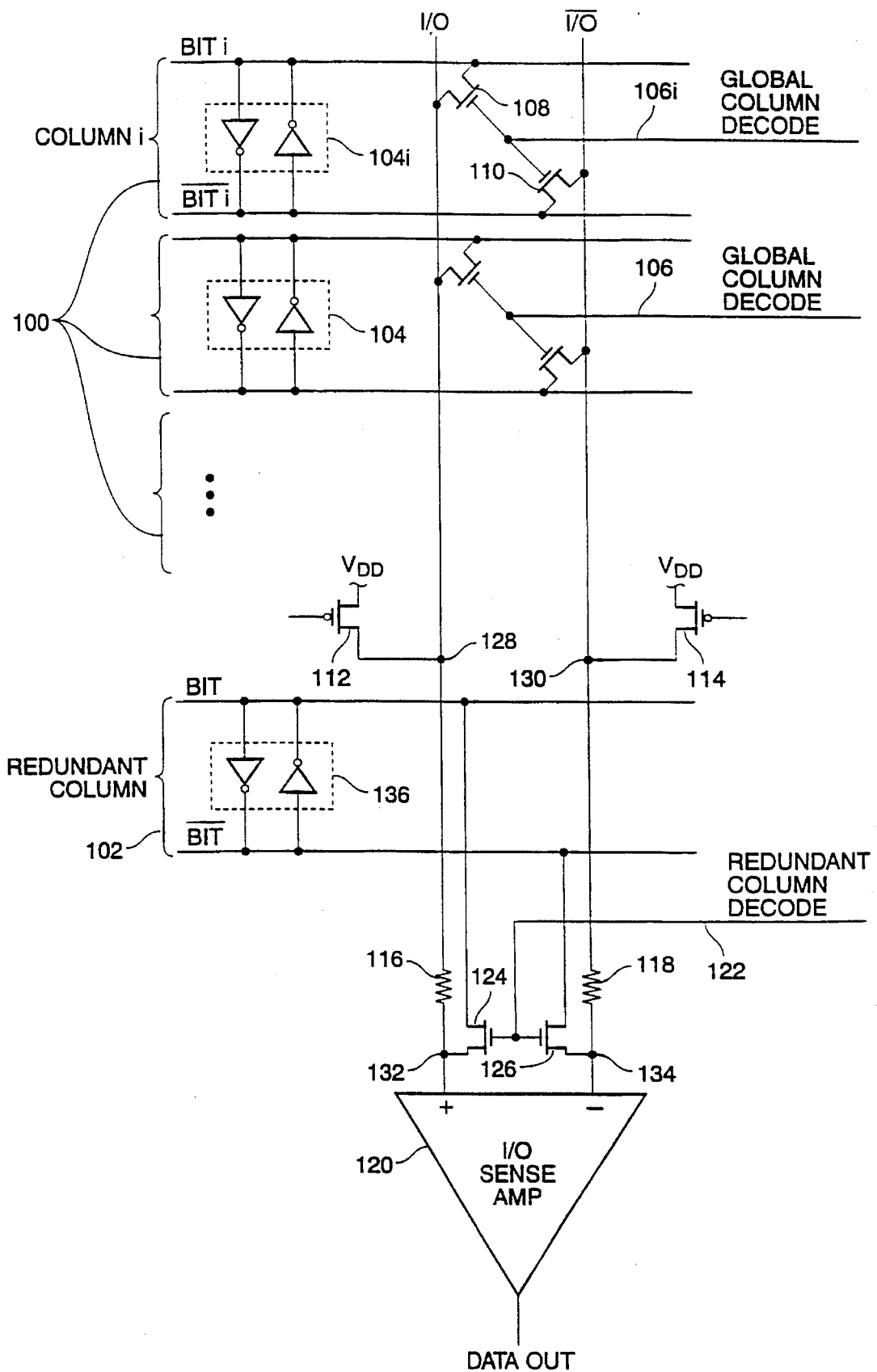
FIG. 1 is a circuit schematic of a section of a dynamic random access memory circuit showing column redundancy according to the present invention.

The redundancy scheme of the present invention can be employed in both static and dynamic random access memory circuits that use redundant rows and/or columns. FIG. 1 is an exemplary circuit schematic of a section of a dynamic random access memory (DRAM) showing a column redundancy scheme according to the present invention. Each of a plurality of column lines 100 in a main memory array include BIT and $\overline{BIT}$ lines that are precharged to a predetermined voltage. BIT and $\overline{BIT}$ connect to a plurality of memory cells (not shown). Once a memory cell is accessed, a voltage differential develops between BIT and $\overline{BIT}$ in response to the contents of the accessed memory cell. A sense amplifier 104 connects to each column line 100 and detects the voltage differential across BIT and $\overline{BIT}$. The sense amplifier 104 amplifies the differential voltage to develop full complementary logic levels at BIT and $\overline{BIT}$. The source/drain terminals of a pair of select transistor 108 and 110 connect the BIT and $\overline{BIT}$ lines in each column 100 to a pair of complementary input/output (I/O) lines, respectively. A global column decode line 106 connects to the gate terminals of select transistors 108 and 110 in each column 100, such that when asserted a selected BIT and $\overline{BIT}$ connect to I/O and $\overline{I/O}$ lines. I/O and $\overline{I/O}$ are connected to the positive supply via PMOS transistors 112 and 114, respectively. The length and width of transistors 112 and 114 are selected to obtain an effective source to drain resistance of, for example, 400 ohms. During memory read cycles, the gate terminals of PMOS transistors 112 and 114 are at the negative power supply voltage VSS. I/O and $\overline{I/O}$ connect to differential inputs of a differential I/O sense amplifier 120 through a pair of resistors 116 and 118, respectively.

When a global column decoder is asserted, a pair of bit lines connects to the I/O lines, and a voltage differential develops across the I/O lines. Assume that upon accessing a memory cell in column 100$i$, BIT$_i$ and $\overline{BIT}_i$ move to the positive supply VDD and the negative supply VSS, respectively. With global column decode line 106$i$ at VDD, NMOS select transistor 110 will have a large gate to source voltage. Select transistor 110 thus turns ON and its conductive channel connects $\overline{I/O}$ to $\overline{BIT}_i$. Current starts to flow from VDD, through PMOS transistor 114 and select transistor 110, and to VSS through sense amplifier 104$i$. The amount of this current is fixed and limited by the saturation current of select transistor 110. Assuming a saturation current of 1 mA and an effective resistance value of, for example, 400 ohms for PMOS transistor 114, the voltage at $\overline{I/O}$ drops from VDD to VDD-0.4 v. The voltage at I/O remains unchanged at VDD. If the redundant column decode is not selected, there are no voltage drops across resistors 116 and 118 since the inputs of I/O sense amplifier 120 draw zero current. Thus, a voltage differential of 0.4 develops at the inputs of I/O sense amplifier 120. With 0.4 volts lower voltage at the negative input of I/O sense amplifier 120 as compared to its positive input, the output of I/O sense amplifier 120 will be high, signaling a logical "1."

Now, assuming column 100$i$ is a defective column, redundant column decoders are programmed to select a redundant column 102 when column 100$i$ is addressed. Thus, when global column decode line 106$i$ is asserted, redundant column decode 122 is also asserted. Redundant select transistors 124 and 126 connect BIT and $\overline{BIT}$ lines of redundant column 102 to I/O and $\overline{I/O}$, respectively. The connection is similar to the main column lines except that redundant select transistors connect the redundant BIT and $\overline{BIT}$ lines to the I/O lines at the other side of resistors 116 and 118 (i.e., directly at the inputs to differential I/O sense amplifier 120). That is, while all main column lines 100 connect to I/O lines at nodes 128 and 130, redundant column lines 102 connect to I/O lines at nodes 132 and 134. Assume that the correct data in the accessed redundant memory cell is opposite in polarity to the data accessed in the memory cell in column 100$i$. When column 100$i$ is selected, in addition to the 1 mA current flowing through PMOS transistor 114 from defective column 100$i$, there will be a 1 mA current flowing from VDD, through PMOS transistor 112 and resistor 116, through redundant column select transistor 124, and into VSS via redundant sense amplifier 136. If the value of the resistance for resistor 116 is also 400 ohms, then the 1 mA through transistor 124 causes a voltage drop of 0.4 v across 400 ohm resistor 116 and a second 0.4 v drop across 400 ohm PMOS transistor 112. Thus, the voltage at node 132 would equal VDD-0.8 volts. As a result, the voltage at the positive input of differential I/O sense amplifier 120 will be 0.4 volts less than the voltage at its negative input. Data out, therefore, signals a logical "0" instead of a faulty logical "1." Thus, the contents of redundant column 102 override the contents of defective column 100$i$, eliminating the need to disconnect or deselect defective column 100$i$. The delay caused by the addition of resistors 116 and 118 is negligible since the amount of parasitic capacitance at nodes 132 and 134 is minimal. Given a typical value of, for example, 0.05 pF for the amount of parasitic capacitance at nodes 132 and 134, the delay caused by the RC time constant of resistor 116 or 118 driving node 132 or 134 would be approximately 400Ω×0.05 pF=0.02 ns.

A very similar approach to the above embodiment precharges the I/O lines to VDD by turning PMOS transistors 112 and 114 on between cycles, and then turning them off at the beginning of the read cycle. PMOS transistors 112 and 114 are turned off at substantially the same time as when select transistors 108 and 110 are turned on. The basic principals of operation are the same, except unlike the above embodiment where the voltage on the I/O lines exponentially decays to a minimum of VDD-0.4 volts, by disconnecting the I/O lines from VDD, the circuit of this embodiment would allow the voltage on the I/O lines to ramp down all the way to VSS if enough time were allowed. But the select transistors 108, 110, 124, and 126 are deselected long before this occurs. In both embodiments, however, the current through resistors 116 or 118 cause a predominating voltage drop across the I/O lines when a redundant element is selected Thus, the redundancy circuit of the present invention does not disturb the operation of the defective element, and allows the defective element to generate bad data. By adding a pair of small resistors as shown in FIG. 1, however, the data from the redundant element simply overrides the bad data. This circuit therefore eliminates the need for fuses on the pitch of the column, or additional circuitry for logical deselection.

An alternative embodiment of the present invention based on the same principal increases the size of redundant select transistors 124 and 126, and eliminates the need for resistors 116 and 118. Larger redundant select transistors increase the amount of saturation current flowing through transistors 124 or 126 compared to the saturation current of normal select transistors 108 and 110. Thus, when a redundant column 102 is selected, it causes more current to flow through one of the PMOS transistors 112 or 114 than that caused by the (defective) normal column. This in turn causes a larger voltage drop across it's PMOS transistor 112 or 114 than that caused by the normal column. When a redundant column is selected, the larger voltage drop simply overrides the smaller voltage drop on the I/O lines due to the bad data from the defective column. Depending on the stability requirements of redundant sense amplifier 136, this approach may require increasing the transistor sizes in redundant sense amplifier 136 as well.

Figure 2:
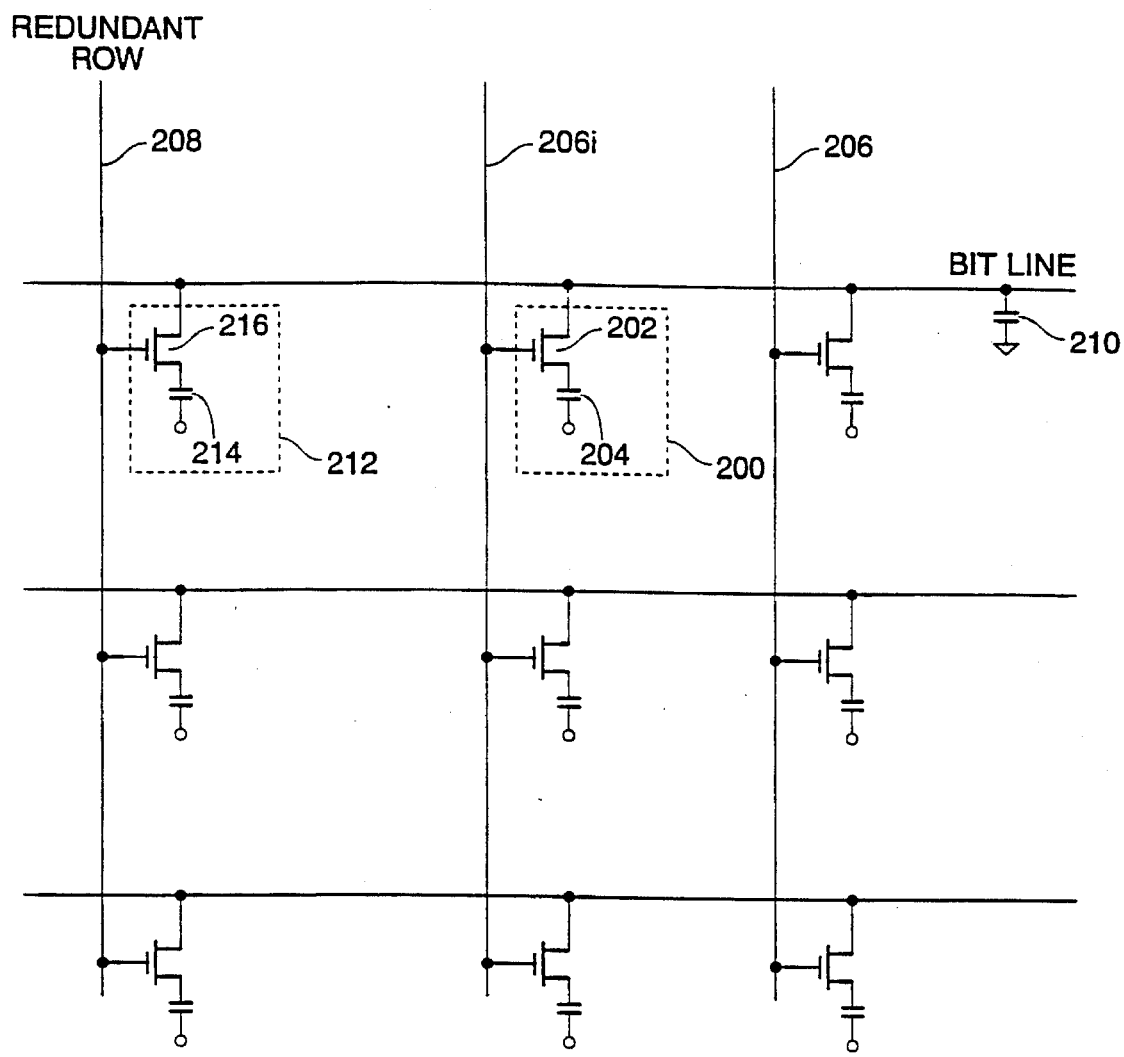
FIG. 2 illustrates a row redundancy scheme for a dynamic random access memory circuit according to the present invention.

Another embodiment of the present invention based on the same principal can be employed for row redundancy. FIG. 2 shows a row redundancy circuit for a DRAM according to this embodiment. A DRAM memory cell 200 includes an access transistor 202 that connects a storage capacitor 204 to a bit line. A row line 206 within a given array connects to the gate terminals of access transistors of a plurality of memory cells 200. When a particular row line 206i is selected, all access transistors 202 connecting to the row line turn on, allowing charge sharing to occur between the bit line parasitic capacitance 210 and the memory cell storage capacitor 204. A sense amplifier detects the increase or decrease in bit line voltage from the memory cell and drives the complementary bit lines to full logic levels (VSS and VDD) depending on the original voltage of stored in the memory cell. A selected column decode line then connects a selected pair of bit lines to the I/O lines as described in connection with FIG. 1. The circuit further includes programmable redundant row decoders (not shown) that select redundant rows 208. When a row 206 is found to be defective, redundant row decoders are programmed such that when the defective row is addressed, a redundant row 208 is also selected.

To eliminate the need for disabling a defective row 206, storage capacitors 214 in redundant memory cells 212 are made larger, for example, twice the size of storage capacitor 204 in main memory cells 200. Alternatively two normal sized redundant cells could be simultaneously selected along with the normal cell to achieve the same result. When a defective row 206 is selected, the amount of charge on the bit line is affected by both storage capacitor 204 and redundant storage capacitor 214. However, the Δv caused by redundant storage capacitor 214 would be twice as large as that of storage capacitor 204. Therefore, redundant memory cell 212 dominates the charge sharing process on the bit line and effectively overrides the impact of the defective memory cell. Once again, neither fuses nor logical deselection is required. Larger redundant storage capacitors 214 increase the size of redundant memory cells 212. However, since the number of redundant memory cells 212 are limited, the overall impact on the size of the integrated circuit chip is insignificant.

Figure 4:
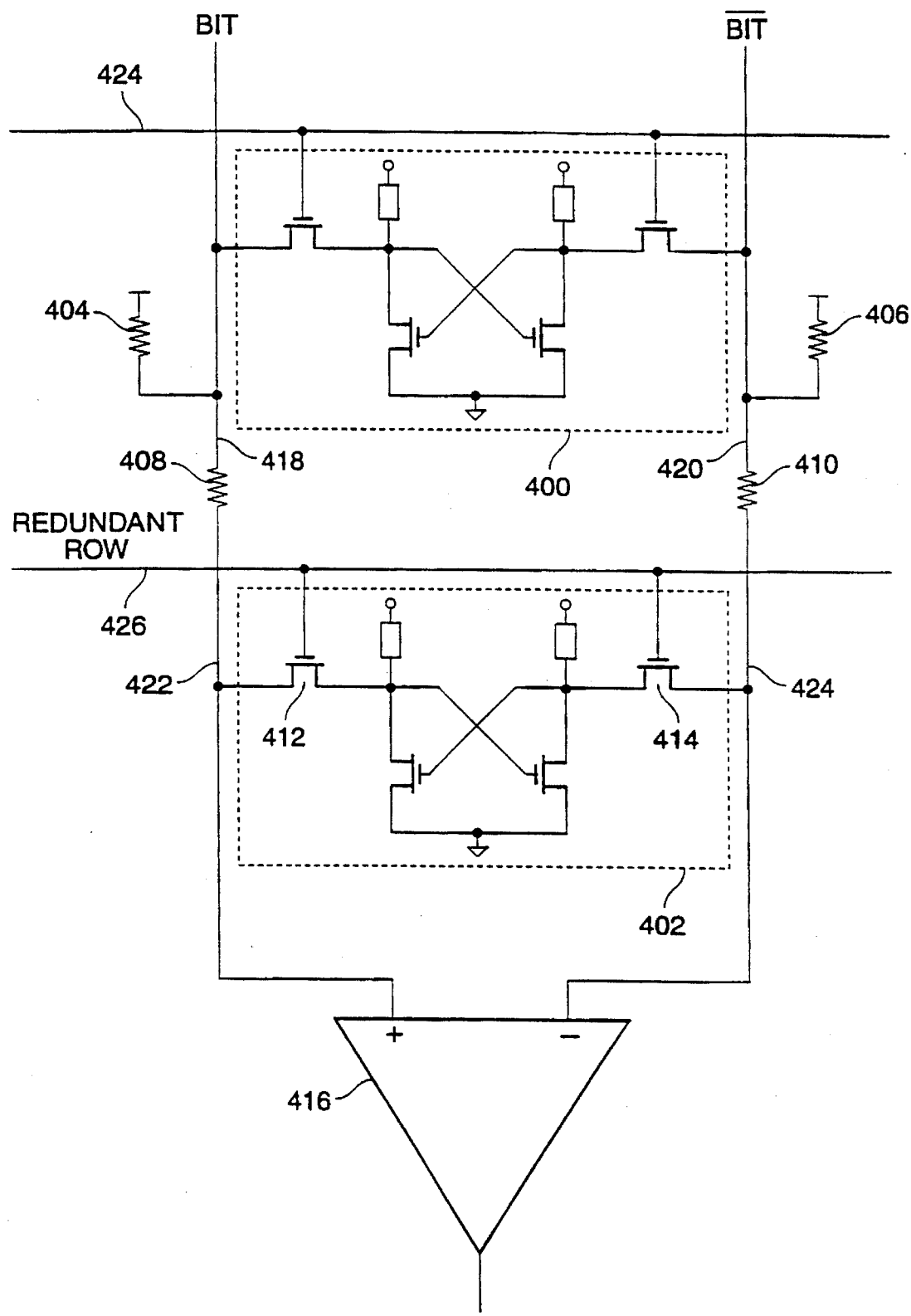
FIG. 4 shows another embodiment for row redundancy in static random access memory circuits according to the present invention.

Equivalents to these techniques can be applied to static random access memory (SRAM) circuits. For example, there are at least two methods of providing row redundancy in SRAMs based on the principals of the present invention. In a first embodiment, dominant redundant rows can be obtained by including a pair of resistors on BIT and $\overline{BIT}$ lines with SRAM redundant rows connecting to the other side of the resistors. Referring to FIG. 4, there is shown a memory cell 400 and a redundant memory cell 402. The two memory cells are constructed similarly except that main memory cells connect to BIT and $\overline{BIT}$ at nodes 418 and 420 while redundant memory cells connect to BIT and $\overline{BIT}$ at nodes 422 and 424, on the other side of resistors 408 and 410. The operation of this embodiment is similar to the column redundancy circuit shown in FIG. 1. When a defective row 424 is selected, a corresponding redundant row 426 is also selected. One memory cell from each row (400 and 402) connects to a selected pair of BIT and $\overline{BIT}$ lines. Similar to the column redundancy circuit described in connection with FIG. 1, current flows through resistor 408 or 410 only when redundant memory cell 402 is selected. This generates a larger voltage drop which overrides the impact of the defective memory cell on BIT and $\overline{BIT}$. A differential sense amplifier 416 connecting to nodes 422 and 424, thus responds to the contents of redundant memory cell 402. This circuit eliminates the need for disabling the defective row and allows the correct output data to predominate over the bad data contained in a defective row.

Figure 3:
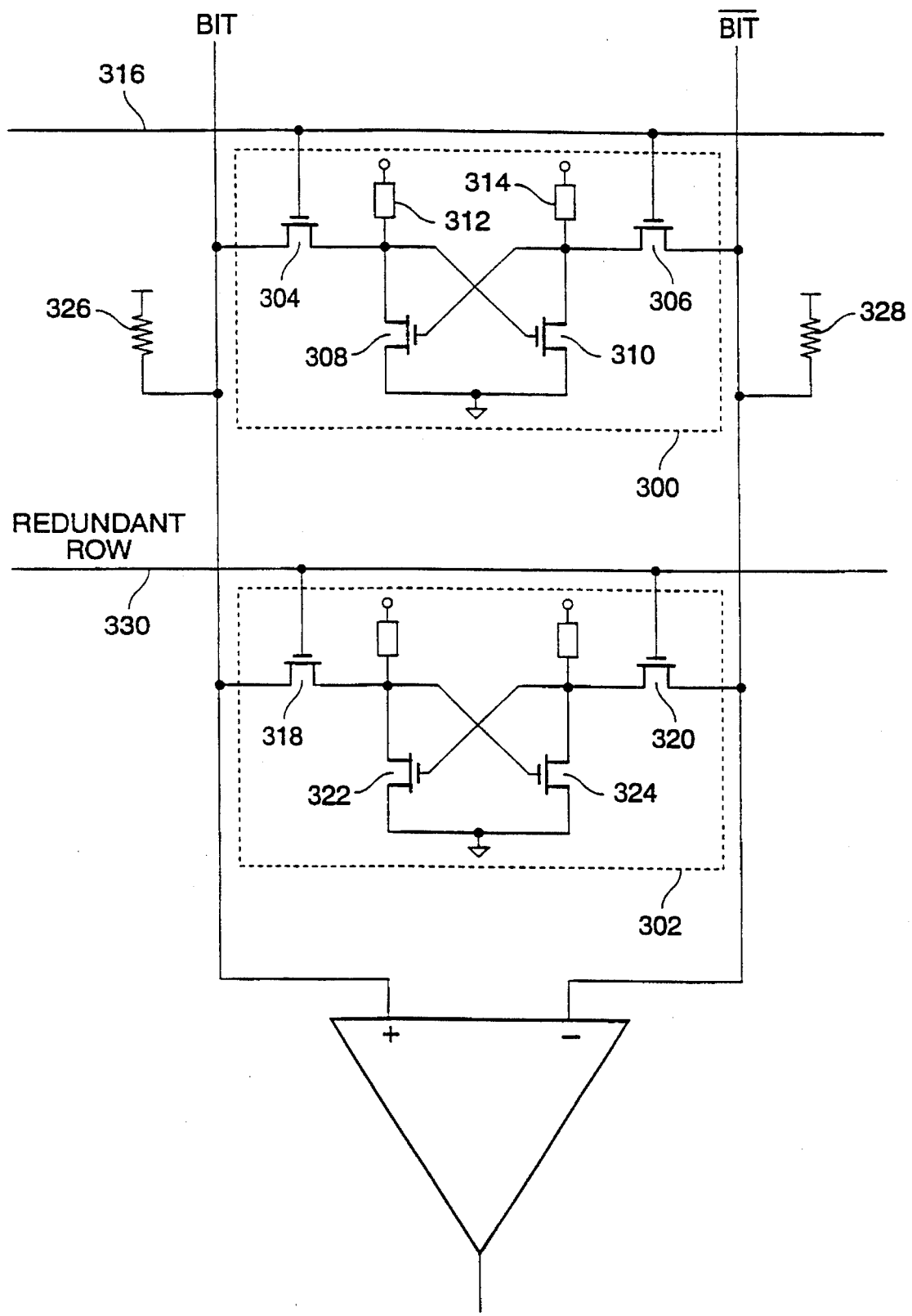
FIG. 3 illustrates a row redundancy scheme for use in static random access memory circuits according to the present invention.

In a second embodiment, all NMOS transistors for a typical SRAM cell are made wider in the redundant rows than those in the main memory array. FIG. 3 shows a typical SRAM cell 300 and a redundant cell 302. Memory cell 300 includes access transistors 304 and 306 that connect the cell to BIT and $\overline{BIT}$, respectively. BIT and $\overline{BIT}$ are charged to VDD by resistors (or PMOS transistors) 326 and 328, respectively. The gate terminals of access transistors 304 and 306 connect to a row decode line 316. Memory cell 300 also includes a storage latch made up of a cross-coupled pair of transistors 308 and 310, and load devices 312 and 314. Except for transistor sizes, redundant memory cell 302 has an identical structure as memory cell 300, with redundant access transistors 318 and 320 connecting it to BIT and $\overline{BIT}$, respectively. The gate terminals of access transistors 318 and 320 connect to a redundant row 330. However, the widths of the access transistors 318 and 320 and cross-coupled transistors 322 and 324 of the redundant cell 302 are made larger than their counterparts in memory cell 300. Thus, when a defective row is selected, the read current flowing through resistor 326 or 328 would be larger for redundant cell 302 than the read current for a defective cell. Redundant memory cell 302, therefore, causes a larger voltage drop allowing its contents to override the contents of the defective cell. No fuses or logical deselection is necessary to disable the defective row. Note that in this case, the sizes for the cross-coupled pair of transistors 322 and 324 in redundant SRAM cell 302 must also be increased to ensure stability of the latch.

In conclusion, the present invention provides a redundancy scheme for memory circuits that eliminates the need for physical disconnection or logical deselection of defective elements. Defective elements are allowed to operate and generate bad data. The redundancy circuit of the invention provides a mechanism for the redundant element to override the impact of the defective element. Several different means have been described for providing a dominant redundant element in connection with integrated circuit memories.

While the above is a complete description of specific embodiments of the present invention, various modifications, variations and alternatives may be employed. The scope of this invention, therefore, should not be limited to the embodiments described, and should instead be defined by the following claims.

What is claimed is:

1. A random access memory circuit comprising:

a main memory column select transistor for coupling a column line to a data line;

a data sense amplifier coupled to the data line; and a redundant column select transistor for coupling a redundant column line to the data line, wherein the redundant column select transistor has a larger channel width to length ratio than the main memory column select transistor, whereby a signal from the redundant column select transistor overrides a signal from the main memory column select transistor.

2. A random access memory circuit comprising:

a column sense amplifier having a first and second transistors coupled to a column line; and a redundant column sense amplifier having a third and fourth transistors coupled to a redundant column line, wherein, the third and fourth transistors in the redundant column sense amplifier have a larger channel width to length ratio compared to the first and second transistors in the column sense amplifier.

* * * * *